United States Patent
Yochem

(10) Patent No.: US 6,745,015 B2
(45) Date of Patent: Jun. 1, 2004

(54) METHOD FOR AUTOMATIC CARRIER SUPPRESSION TUNING OF A WIRELESS COMMUNICATION DEVICE

(75) Inventor: Donald M. Yochem, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 675 days.

(21) Appl. No.: 09/779,805

(22) Filed: Feb. 8, 2001

(65) Prior Publication Data

US 2002/0137487 A1 Sep. 26, 2002

(51) Int. Cl.[7] .......................... H04B 1/04; H01Q 11/12; H04L 27/36
(52) U.S. Cl. .................... 455/126; 455/108; 455/114.2; 375/298; 375/308
(58) Field of Search ................................ 455/126, 124, 455/125, 108–111, 114.1, 114.2, 115.1–115.3, 119, 295, 296, 303; 332/100, 103, 144, 149; 375/224, 279, 280, 281, 283, 308, 296, 298

(56) References Cited

U.S. PATENT DOCUMENTS

| | | | |
|---|---|---|---|
| 4,717,894 A | * | 1/1988 | Edwards et al. ......... 455/115.3 |
| 5,371,481 A | | 12/1994 | Tiittanen et al. ............ 332/103 |
| 5,510,845 A | | 4/1996 | Yang et al. |
| 5,542,096 A | * | 7/1996 | Cygan et al. ............ 455/115.2 |
| 5,933,448 A | | 8/1999 | Katisko ....................... 375/219 |
| 6,384,677 B2 | * | 5/2002 | Yamamoto .................... 330/10 |
| 6,421,398 B1 | * | 7/2002 | McVey ....................... 375/308 |

FOREIGN PATENT DOCUMENTS

GB 2213006 * 8/1989 ............ H03C/1/06

* cited by examiner

Primary Examiner—Duc M. Nguyen
(74) Attorney, Agent, or Firm—Shigehara Furukawa

(57) ABSTRACT

This invention is a method of carrier suppression tuning of a wireless communication device (100) utilizing a quadrature modulator (104) in a transmission path (102). A power detector (128) and a processor (132) are coupled to the ends of the transmission path (102) to provide feedback to the quadrature modulator (104) and, thus, minimizes carrier feedthrough. For this invention, the transmission path (102) of the device (100) is enabled and "I" and "Q" DC offset values are set to default values. Then, output voltages from the power detector (128) are sampled and the "I" DC offset value is adjusted based on the sampled voltages. Similarly, output voltages from the power detector (128) are sampled and the "Q" DC offset value is adjusted based on the sampled voltages. These steps of sampling and adjusting for the "I" and "Q" DC offset values are repeated until the power detector (128) produces an output that is less than a predetermined threshold value.

10 Claims, 4 Drawing Sheets

METHOD FOR AUTOMATIC CARRIER SUPPRESSION TUNING OF A WIRELESS COMMUNICATION DEVICE

FIELD OF THE INVENTION

The present invention relates generally to the field of wireless transmitters and, particularly, to suppression tuning of carrier signals transmitted by a radio telephone.

BACKGROUND OF THE INVENTION

A quadrature modulator is the combination of two mixers and a quadrature phase shift block. This combination forms a structure that allows the creation of linear modulation when excited by a signal that has been split into its quadrature components. The quadrature components of the modulating signal are the in-phase ("I") signal and the quadrature ("Q") signal. The outputs of the two mixers are summed ("Σ") to produce the overall modulator output.

Many digital radio transceivers of wireless communication devices utilize a quadrature modulator in the transmission path to generate the desired radio frequency output signal. A quadrature modulator is the only practical approach for wireless communication device designed to operate in any digital wireless communication systems, such as IS136, PDC, CDMA and EDGE, which utilize a modulation type requiring a non-constant transmit envelope. For constant envelope systems, such as GSM and AMPS, a quadrature modulator is often used because it represent a practical approach to the modulation problem, particularly when a device is intended for use in multiple systems.

The problems with quadrature modulators are due to the fact that they are not perfect. They suffer various impairments that ultimately impact the performance of the transmitter, such as carrier feedthrough. Carrier feedthrough arises primarily because of DC offsets in the various circuits that constitute the modulator circuit. These circuits include the digital-to-analog ("D/A") converter that generates the modulator input as well as any filters after the converter, the individual devices in the IQ mixer, and the devices that provide the local oscillator ("LO") signal to the mixers.

Several approaches to the above problem specify the performance of both the D/A converter and the quadrature modulator as tightly as possible. These approaches work well for many systems, although there is a measurable yield hit at the integrated circuit test level. However, the radio level requirement for carrier feedthrough is significantly more stringent for future systems.

In any analog implementation of a quadrature modulator, non-ideal conditions exist with respect to amplitude balance, phase accuracy and DC offsets. Several techniques exist for dealing with amplitude balance and phase accuracy, but a viable, inexpensive technique for dealing with DC offsets is still needed and desired. DC offset in the I path is equal to the ratio of the absolute DC offset to the peak value of the I baseband signal, and the DC offset in the Q path is equal to the ratio of the absolute DC offset to the peak value of the Q baseband signal.

Radio transceivers that correct amplitude and/or phase errors between I and Q branches of a quadrature modulator are generally known in the art. For example, U.S. Pat. No. 5,933,448 to K. Katisko titled Automatic Tuning of a Radio Transceiver describes a transmission signal is sampled and directed to a TRX loop mixer and, then, directed to a reception branch for Received Signal Strength Indicator ("RSSI") calculation. The existing circuitry of a radio transceiver requires the addition of a loop mixer, a local oscillator and a pair of directional couplers to implement the correction scheme of this patent.

Also, U.S. Pat. No. 5,371,481 to E. Tiittanen, et al. titled Tuning Technique For I/Q Channel Signals in Microwave Digital Transmission Systems describes a vector modulation system that compensates baseband magnitude and phase errors. A filter power meter, such as a spectrum analyzer, that is external to the system and power control unit is connected to an antenna to measure the narrow band RF-power. The system compensates the baseband magnitude and phase errors based on the difference between the desired sideband and the undesired sideband. The existing circuitry of a radio transceiver must be connected to an external power meter and measurement processor to implement the correction scheme of this patent.

In view of the above, there is a need for a viable technique for controlling carrier feedthrough or, more particularly, dealing with DC offset problems. The cost of implementing the technique must be inexpensive so that it may remain viable. Also, the technique should not require external test equipment and should be relatively fast. Thus, the technique should be implemented using as many existing components of a typical wireless communication device as possible. In addition, the above technique must maintain the stringent radio level requirements for carrier feedthrough for present as well as future systems.

DETAILED DESCRIPTION OF THE PREFERRED EMBODIMENT

The present invention is a method for a wireless communication device that minimizes carrier feedthrough, i.e. carrier suppression tuning, by using feedback from a power detector and processor present in the device. The method of the present invention utilizes quadrature modulation in a transmission path, and the wireless communication device includes a quadrature modulator, a power detector and a processor coupled to the quadrature modulator and the power detector. The power detector and the processor are coupled to the ends of the transmission path to provide feedback to the quadrature modulator and, thus, minimize carrier feedthrough.

For the method of the present invention, the transmission path of the device is enabled, and "I" and "Q" DC offset values are set to default values. Then, output voltages from the power detector are samples, and the "I" DC offset value is adjusted based on the sampled voltages. Similarly, output voltages from the power detector are sampled, and the "Q" DC offset value is adjusted based on the sampled voltages. Thereafter, the step of sampling output voltages and adjusting the "I" DC offset value and the step of sampling output voltages and adjusting the "Q" DC offset value are repeated until the power detector produces an output that is less than a predetermined threshold value.

Figure 1:
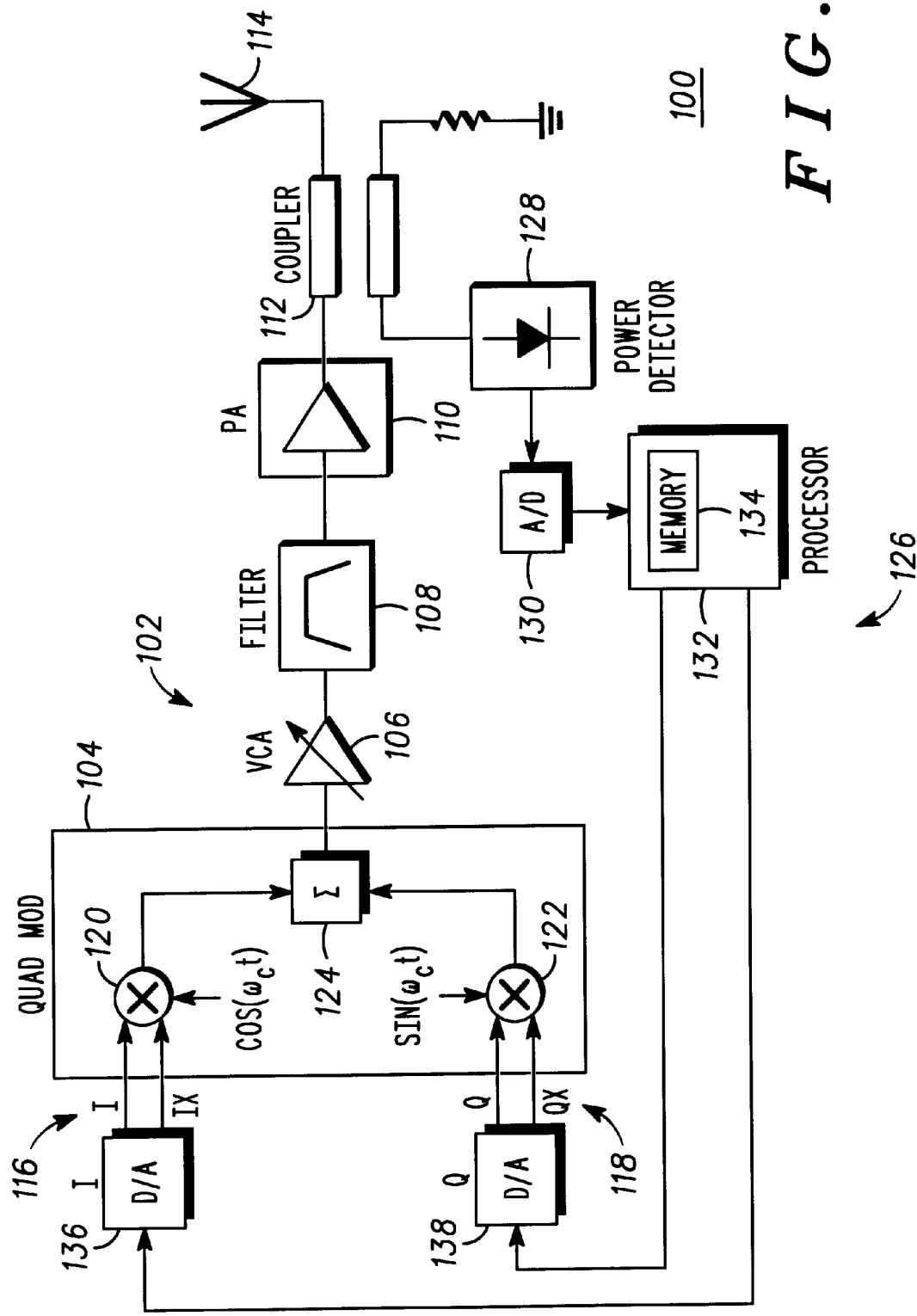
FIG. 1 is a block diagram of a preferred tuning system of the present invention.

Referring to FIG. 1, there is provided a block diagram that illustrates the hardware of a preferred embodiment 100. The preferred wireless communication device has a transmission path 102 that includes a quadrature modulator 104, a voltage controlled attenuator ("VCA") 106, a filter 108, a power amplifier 110, a coupler 112 and an antenna 114. As shown in FIG. 1, the VCA 106 may be placed after the quadrature modulator 104 to provide power control in the linear transmit lineup. The filter 108, which follows the VCA 106, removes out-of-band emissions from the output of the VCA. Subsequent to the filter 108, the power amplifier 110 amplifies the output of the filter to the coupler 112 and the antenna 114 for wireless transmission to other communication devices and base stations.

The quadrature modulator 104 provides linear modulated output when the modulator receives inputs at its I path 116, namely I and IX, and at its Q path 118, namely Q and QX. The quadrature modulator 104 includes an I mixer 120 that receives in-phase signals along the I path 116 and a Q mixer 122 that receives quadrature signals along the Q path 118. The outputs of the I and Q mixers 120, 122 are fed into a summing component 124 to produce a modulator output. This modulator output is received by the VCA 106 for processing, as shown in FIG. 1. The present invention calibrates the I and Q signals of the modulator 104 for proper DC offsets.

All sources of DC offsets may be lumped into two constants, $\xi$ for the I path 116 and $\epsilon$ for the Q path 118. For the case of sinusoidal signals as baseband inputs, the inputs to the I mixer 120 are I=½ cos($\omega_a t$) and IX=$\xi$-½ cos($\omega_a t$), and the inputs for the Q mixer 122 are Q=½ sin($\omega_a t$) and QX=$\epsilon$-½ sin($\omega_a t$). Accordingly, the output for the I mixer 120 is:

$$IMIX = (I - IX) * \cos(\omega_c t) \quad \text{Eq. (1)}$$

$$= (\cos(\omega_a t) - \xi) * \cos(\omega_c t) \quad \text{Eq. (2)}$$

$$= 1/2 \cos(\omega_c - \omega_a)t + 1/2 \cos(\omega_c + \omega_a)t - \xi \cos(\omega_c t) \quad \text{Eq. (3)}$$

and the output for the Q mixer 122 is:

$$QMIX = (Q - QX) * \sin(\omega_c t) \quad \text{Eq. (4)}$$

$$= (\sin(\omega_a t) - \varepsilon) * \sin(\omega_c t) \quad \text{Eq. (5)}$$

$$= 1/2 \cos(\omega_c - \omega_a)t - 1/2 \cos(\omega_c + \omega_a)t - \varepsilon \sin(\omega_c t) \quad \text{Eq. (6)}$$

Therefore, the summation of the I mixer output and Q mixer output produces a final output of cos$\omega_c$-$\omega_a$)t-$\xi$ cos ($\omega_c$t)-$\epsilon$ sin(($\omega_c$t). The output consists of the desired sideband plus two orthogonal tones at the carrier frequency.

The preferred embodiment also includes a feedback path 126, which extends from the coupler 112 to the inputs, namely I path 116 and Q path 118, of the quadrature modulator 104. The feedback path 126 includes a power detector 128, an analog-to-digital converter 130, a processor 132, which includes a memory portion 134, and a pair of digital-to-analog converters 136, 138. The power detector 128 is connected to the coupler 112 to measure the output power level of the transmission path 102 at the coupler. The analog-to-digital converter 130 converts the output of the power detector 128 to digital form for input to the processor 132. In response, the processor 132 generates an "I" DC offset signal and a "Q" DC offset signal, and the pair of digital-to-analog converters 136, 138 convert the DC offset signals to analog form for input to the I path 116 and Q path 118 of the quadrature modulator 104.

Figures 2, 3:
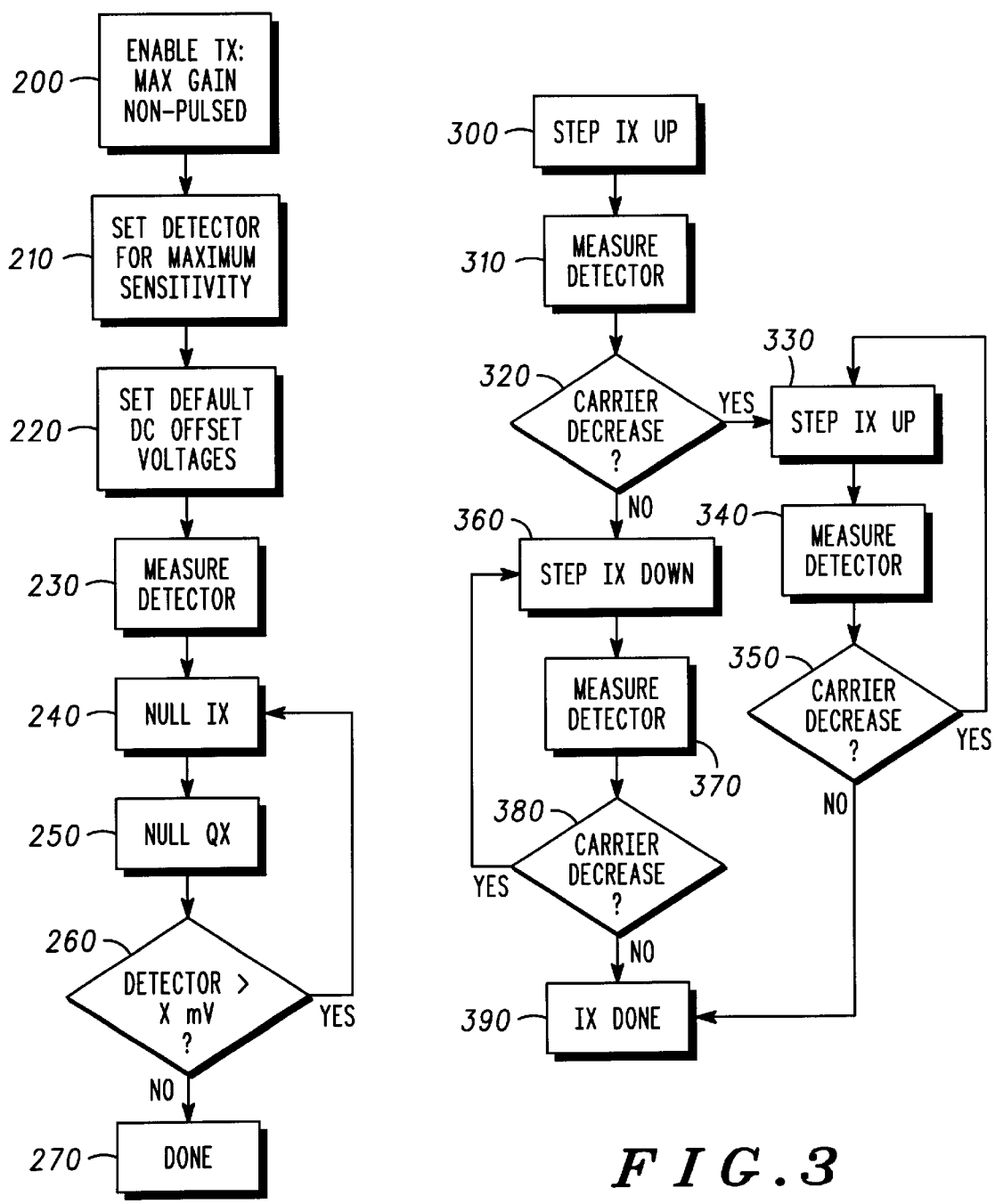
FIG. 2 is a flow diagram of the operation of the processor of FIG. 1.
FIG. 3 is a flow diagram of the operation of the Null IX and Null QX procedures of FIG. 2.

Referring to FIG. 2, there is provided a flow chart representing the operation of the preferred embodiment 100. When the carrier nulling mode is desired, the processor 132 forces the I and Q digital-to-analog converters 136, 138 to output their normal DC values. As shown by step 200, the transmission path 102 is enabled and the VCA 106 is set to a maximum gain level. Also, the transmission path 102 is continuously controlled (non-pulsed) to facilitate measurement of the output signal of the transmission path 102. The power detector 128 is then set for maximum sensitivity as shown by step 210. The "I" and "Q" DC offset values are set to default values by the processor 132 as shown by step 220. For the preferred embodiment, the DC offset voltages are set to zero, but it is to be understood that other values may be used as well.

The processor 132 measures the output of the power detector 128 and stores this initial measurement as a prior output voltage in its memory 134 as shown by step 230. Although the memory 134 may be external to the processor 132, the memory is embedded within the processor for the preferred embodiment. Under these conditions, the output of the power detector 128 is a measurement of the carrier power only. As shown by steps 240, 250 and 260, the processor 132 then enters a loop where it samples the output of the power detector 128 and adjusts the DC offset value of the I data converter 136 and the Q data converter 138 based on the sampled reading. For the preferred embodiment, the output voltages from the power detector 128 are sampled and the "I" DC offset value is adjusted based on the sampled voltages as shown by step 240. Then, output voltages from the power detector 128 are sampled and the "Q" DC offset value is adjusted based on the sampled voltages as shown by step 250. However, it is to be understood that the "Q" DC offset value may be adjusted before or simultaneously with the "I" DC offset value. Thereafter, the step of sampling output voltages and adjusting the "I" DC offset value and the step of sampling output voltages and adjusting the "Q" DC offset value are repeated until the loop ends. When the loop ends, the processor 132 has completed the operation of the present invention as shown by step 270.

Referring to step 260 of FIG. 2, the loop may be end when the output voltage sampled from the power detector 128 drops below a predetermined value or no longer decreases with each succeeding interval. For example, for the preferred embodiment, the loop ends when the power detector 128 produces an output that is less than a predetermined value as shown by step 260. The predetermined threshold value is a maximum value permissible for desirable operation of the device. In the alternative, the loop may be end by any other method in which the output voltage sampled from the power detector 128 no longer decreases with each succeeding interval.

Referring FIG. 3, there is provided a flow chart representing the sub-steps of step 240 of FIG. 2. As indicated in step 230 of FIG. 2, an prior output voltage is measured and stored in the memory 134 of the processor 132. In step 300 of FIG. 3, the "I" DC offset value is adjusted in a first direction, either up or down, by a particular increment. For the preferred embodiment, the "I" DC offset value is stepped-up by one increment, such as one step of the data converter resolution. A subsequent output voltage of the power detector 128 is then measured and stored in the memory 134 as shown by step 310. The processor 132 then determines whether to adjust the "I" DC offset value in the first direction consistent with the previous adjustment performed in step 300 or a second direction opposite the previous adjustment performed in step 300. Referring specifically to step 320 of FIG. 3, the "I" DC offset value is adjusted in the same direction as the adjustment in step 300 when the subsequent output voltage being less than the prior output voltage. The "I" DC offset value is adjusted in the opposite direction as the adjustment in step 300 when the subsequent output voltage being greater than the prior output voltage.

For example, if the power detector output decreases when the "I" DC offset value is stepped-up, then the processor 132 should continue to step-up the "I" DC offset value until the detector output no longer decreases. On the other hand, if the power detector output increases when the "I" DC offset value is stepped-up, then the processor 132 should step-down the "I" DC offset value in an attempt to decrease the detector output. Accordingly, the preferred embodiment shown by FIG. 3 shows the adjustment in the first direction as a step IX up (steps 300 and 330) and the adjustment in the second direction as a step IX down (step 360). In the alternative, step 300 may step the "I" DC offset value down so long as it is stepped-down in step 330 and stepped-up in step 360.

Thereafter, the step of measuring the output of the power detector 128 and storing the measurement in the memory 134 (steps 340 and 370) and the step of adjusting the "I" DC offset value (steps 330, 360) are repeated until the output of the power detector no longer decreases as shown by steps 350 and 380. With each iteration of these steps, the prior output voltage is set aside from the memory 134 or to another part of the memory, and the subsequent output voltage becomes the prior output voltage before each new measurement of the subsequent output voltage. Thus, the newest measurement of the output of the power detector 128 is compared to the most-recent, previous measurement. When stepping the "I" DC offset value no longer drives the output voltage downward, then the procedure for adjusting the "I" DC offset value is done as shown by step 390.

The "Q" DC offset value is adjusted in a similar way. In fact, the flow chart of FIG. 3 also represents step 250 of FIG. 2 in which references to "IX" should be understood to be references to "QX". The "Q" DC offset value is adjusted in a first direction by the particular increment as shown by step 300, and a subsequent output voltage of the power detector 128 is measured as shown by step 310. The "Q" DC offset value is then stepped up or down in the first direction in response to the subsequent output voltage being less than the prior output voltage, and the "Q" DC offset value is stepped up or down in the second direction in response to the subsequent output voltage being greater than the prior output voltage as shown by step 320. Then, the step of measuring and the steps of stepping the "Q" DC offset value are repeated in which the prior output voltage is set aside and the subsequent output voltage becomes the prior output voltage before each measurement of the subsequent output voltage as shown by steps 330, 340, 350, 360, 370 and 380. The procedure is completed when adjustment of the "Q" DC offset value no longer drives the output voltage downward.

Figure 4A:
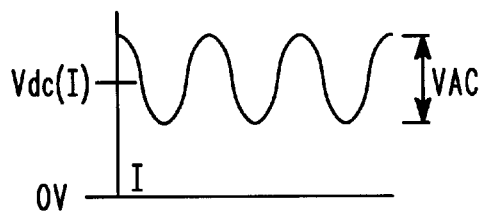
FIGS. 4A through 4D are graphical representations of a first set of baseband inputs (namely I, IX, Q, and QX) to the modulator of FIG. 1.
Figure 4B:
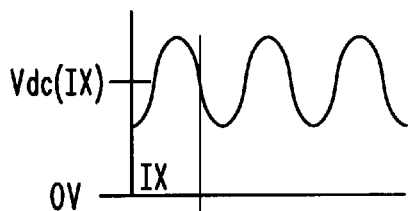
Figure 4C:
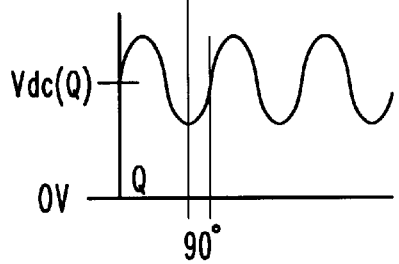
Figure 4D:
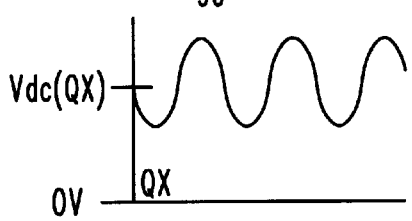
Figure 4E:
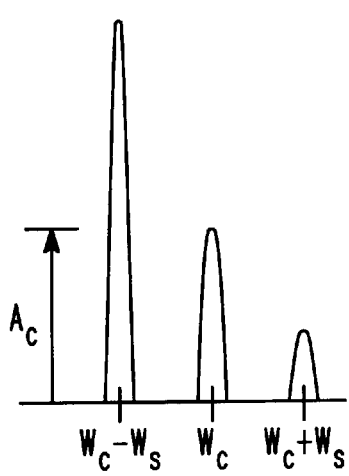
FIG. 4E is a graphical representation of the output spectrum of the modulator of FIG. 1 in response to the first set of baseband inputs of FIGS. 4A through 4D.

Referring to FIGS. 4A through 4E, there is provided an ideal output for a wireless communication device when the device is in operation after it has been manufactured. FIGS. 4A, 4B, 4C and 4D are graphical representations of baseband inputs to the I path and the Q path of the quadrature modulator shown for the special case of sinusoidal inputs. As shown in these figures, these baseband inputs are sinusoidal waves in which the phase difference between the I signal and the Q signal is 90 degrees. FIG. 4E is a graphical representation of the output spectrum of the quadrature modulator in response to the above baseband inputs of FIGS. 4A through 4D.

Figure 5A:
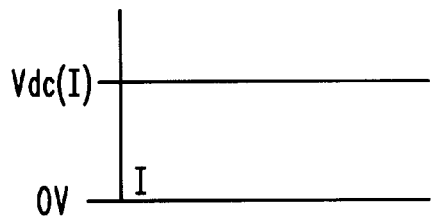
FIGS. 5A through 5D are graphical representations of a second set of baseband inputs (namely I, IX, Q, and QX) to the modulator of FIG. 1.
Figure 5B:
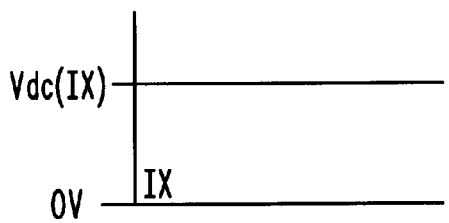
Figure 5C:
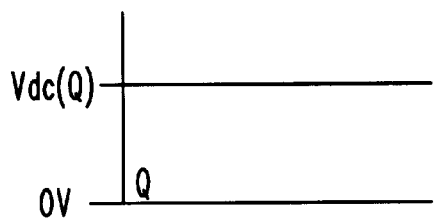
Figure 5D:
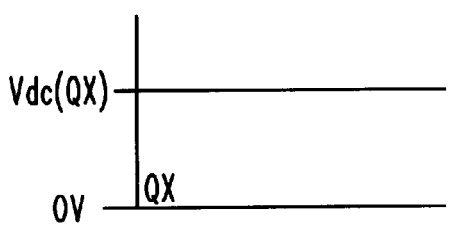
Figure 5E:
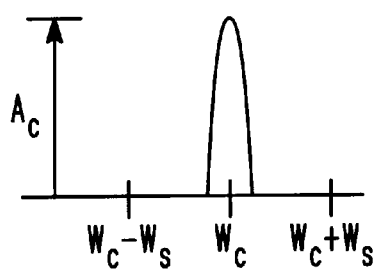
FIG. 5E is a graphical representation of the output spectrum of the modulator of FIG. 1 in response to the second set of baseband inputs of FIGS. 5A through 5D.

Referring to FIGS. 5A through 5E, there is provided an exemplary output for the wireless communication device of the present invention when the calibration or carrier suppression tuning method is applied when the device is being manufactured and tested. FIGS. 5A, 5B, 5C and 5D are graphical representations of baseband inputs to the I path and the Q path of the quadrature modulator in accordance with the present invention. As shown in these figures, these baseband inputs are constant linear signals and, thus, differ from the first set of baseband inputs shown in FIGS. 4A through 4D. FIG. 5E is a graphical representation of the output spectrum of the quadrature modulator in response to the baseband inputs of FIGS. 5A through 5D. The present invention adjusts the voltage level of the inputs to the quadrature modulator so that the amplitude $A_C$ of the output at $W_C$ is minimized.

The present invention is calibration technique for a wireless communication device having quadrature modulator in a transmission path and feedback loop coupled to the transmission path having a power detector and processor. The calibration technique conducts certain operations via the processor to minimizes carrier feedthrough, i.e. carrier suppression tuning. Preferable, this calibration would occur when the device is being manufactured and as a one-time event or test command that is performed when the device is first powered-up. In addition, the cost for implementing the above technique is inexpensive and the test time is minimal.

While the preferred embodiments of the invention have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A method of carrier suppression tuning of a wireless communication device utilizing quadrature modulation in a transmission path, the device including a quadrature modulator, a power detector and a processor coupled to the quadrature modulator and the power detector, the method comprising the steps of:

enabling the transmission path of the device;

setting first and second DC offset values to default values;

sampling output voltages from the power detector and adjusting the first DC offset value based on the sampled voltages;

sampling output voltages from the power detector and adjusting the second DC offset value based on the sampled voltages; and repeating the step of sampling output voltages and adjusting the first DC offset value and the step of sampling output voltages and adjusting the second DC offset value until the power detector produces an output that is less than a predetermined threshold value.

2. The method of claim 1, wherein the step of enabling the transmission path includes the step of setting a voltage controlled attenuator along the transmission path to maximum gain.

3. The method of claim 1, further comprising the step of setting the power detector for maximum sensitivity before the step of sampling and adjusting the first DC offset value.

4. The method of claim 1, wherein the first and second DC offset values are set at the same value.

5. The method of claim 4, wherein the first and second DC offset values are set at zero.

6. The method of claim 1, wherein the step of sampling output voltages and adjusting the first DC offset value includes the steps of:
- determining a prior output voltage of the power detector;
- adjusting the first DC offset value in a first direction by a particular increment;
- measuring a subsequent output voltage of the power detector;
- stepping the first DC offset value in the first direction in response to the subsequent output voltage being less than the prior output voltage;
- stepping the first DC offset value in a second direction opposite the first direction in response to the subsequent output voltage being greater than the prior output voltage; and
- repeating the step of measuring and the steps of stepping the first DC offset value wherein the prior output voltage is set aside and the subsequent output voltage becomes the prior output voltage before each measurement of the subsequent output voltage.

7. The method of claim 6, wherein the step of sampling output voltages and adjusting the second DC offset value includes the steps of:
- adjusting the second DC offset value in the first direction by the particular increment;
- measuring the subsequent output voltage of the power detector;
- stepping the second DC offset value in the first direction in response to the subsequent output voltage being less than the prior output voltage;
- stepping the second DC offset value in the second direction in response to the subsequent output voltage being greater than the prior output voltage; and
- repeating the step of measuring and the steps of stepping the second DC offset value wherein the prior output voltage is set aside and the subsequent output voltage becomes the prior output voltage before each measurement of the subsequent output voltage.

8. The method of claim 7, wherein an adjustment in the first direction steps up the respective DC offset value and an adjustment in the second direction steps down the respective DC offset value.

9. The method of claim 7, wherein an adjustment in the first direction steps down the respective DC offset value and an adjustment in the second direction steps up the respective DC offset value.

10. The method of claim 1, wherein the predetermined threshold value is a maximum value permissible for desirable operation of the device.

\* \* \* \* \*